United States Patent
Lim et al.

(10) Patent No.: US 9,626,311 B2
(45) Date of Patent: Apr. 18, 2017

(54) MEMORY CONTROLLER PLACEMENT IN A THREE-DIMENSIONAL (3D) INTEGRATED CIRCUIT (IC) (3DIC) EMPLOYING DISTRIBUTED THROUGH-SILICON-VIA (TSV) FARMS

(71) Applicant: QUALCOMM Incorporated, San Diego, CA (US)

(72) Inventors: Sung Kyu Lim, Duluth, GA (US); Karamvir Singh Chatha, San Diego, CA (US); Yang Du, Carlsbad, CA (US); Kambiz Samadi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 34 days.

(21) Appl. No.: 14/602,505

(22) Filed: Jan. 22, 2015

(65) Prior Publication Data

US 2016/0217087 A1    Jul. 28, 2016

(51) Int. Cl.
*G06F 13/16* (2006.01)
*H01L 25/065* (2006.01)
(Continued)

(52) U.S. Cl.
CPC ...... *G06F 13/1684* (2013.01); *G06F 13/1605* (2013.01); *G06F 13/4282* (2013.01);
(Continued)

(58) Field of Classification Search
None
See application file for complete search history.

(56) References Cited

U.S. PATENT DOCUMENTS 8,042,082 B2    10/2011    Solomon
8,136,071 B2     3/2012    Solomon
(Continued)

OTHER PUBLICATIONS

Athikulwongse K., et al., "Block-level Designs of Die-to-Wafer Bonded 3D ICs and Their Design Quality Tradeoffs," 2013 18th Asia and South Pacific Design Automation Conference (ASP-DAC), Jan. 22-25, 2013, Yokohama, Japan, IEEE, pp. 687-692.
(Continued)

*Primary Examiner* — Kevin Verbrugge
(74) *Attorney, Agent, or Firm* — Withrow & Terranova, PLLC

(57) ABSTRACT

Aspects disclosed in the detailed description include memory controller placement in a three-dimensional (3D) integrated circuit (IC) (3DIC) employing distributed through-silicon-via (TSV) farms. In this regard, in one aspect, a memory controller is disposed in a 3DIC based on a centralized memory controller placement scheme within the distributed TSV farm. The memory controller can be placed at a geometric center within multiple TSV farms to provide an approximately equal wire-length between the memory controller and each of the multiple TSV farms. In another aspect, multiple memory controllers are provided in a 3DIC based on a distributed memory controller placement scheme, in which each of the multiple memory controllers is placed adjacent to a respective TSV farm among the multiple TSV farms. By disposing the memory controller(s) based on the centralized memory controller placement scheme and/or the distributed memory controller placement scheme in the 3DIC, latency of memory access requests is minimized.

25 Claims, 9 Drawing Sheets

(51) Int. Cl.
*G06F 13/42* (2006.01)
*H01L 23/48* (2006.01)
*H01L 23/50* (2006.01)
*H01L 25/18* (2006.01)
*H01L 25/00* (2006.01)
*H01L 27/06* (2006.01)

(52) U.S. Cl.
CPC ............ *H01L 23/481* (2013.01); *H01L 23/50* (2013.01); *H01L 25/0657* (2013.01); *H01L 25/18* (2013.01); *H01L 25/50* (2013.01); *H01L 27/0688* (2013.01); *H01L 2225/06544* (2013.01)

(56) References Cited

U.S. PATENT DOCUMENTS

| | | | |
|---|---|---|---|
| 8,407,660 | B2 | 3/2013 | Solomon |
| 8,448,119 | B1* | 5/2013 | Gordin ................ G06F 17/5077 716/122 |
| 8,710,676 | B2 | 4/2014 | Chou et al. |
| 2009/0103345 | A1 | 4/2009 | McLaren et al. |
| 2010/0078790 | A1* | 4/2010 | Ito ........................... G11C 5/02 257/686 |
| 2010/0333056 | A1* | 12/2010 | Emma ................ G06F 17/5072 716/119 |
| 2011/0042795 | A1* | 2/2011 | Knickerbocker ..... H01L 21/486 257/686 |
| 2011/0246828 | A1* | 10/2011 | Monchiero ......... G06F 11/1402 714/31 |
| 2012/0134193 | A1 | 5/2012 | Ide |
| 2013/0049223 | A1* | 2/2013 | Nomoto .............. H01L 25/0657 257/774 |
| 2014/0040532 | A1* | 2/2014 | Watanabe ........... G06F 13/1668 711/103 |
| 2014/0040698 | A1* | 2/2014 | Loh ...................... G06F 13/1668 714/758 |
| 2014/0085959 | A1 | 3/2014 | Saraswat et al. |
| 2014/0108841 | A1 | 4/2014 | Tomi |
| 2014/0149958 | A1* | 5/2014 | Samadi ............... G06F 17/5072 716/123 |
| 2015/0016172 | A1* | 1/2015 | Loh .......................... G11C 5/02 365/51 |
| 2015/0199126 | A1* | 7/2015 | Jayasena ............... G11C 11/005 711/103 |
| 2016/0124873 | A1* | 5/2016 | Xu ...................... G06F 13/1636 711/105 |
| 2016/0132403 | A1* | 5/2016 | Lo ......................... G06F 11/201 714/6.2 |

OTHER PUBLICATIONS

Author Unknown, "Cadence Releases Industry's First Wide I/O Memory Controller IP Solution," [Retrieved on Mar. 28, 2011], Cadence Design Systems, Inc., Retrieved from the Internet: URL: http://www.cadence.com/cadence/newsroom/press_releases/pages/pr.aspx?xml=032811_iomem, 2 pages.

International Search Report and Written Opinion for PCT/US2015/066334, mailed Apr. 8, 2016, 10 pages.

Second Written Opinion for PCT/US2015/066334, mailed Jan. 24, 2017, 5 pages.

\* cited by examiner

MEMORY CONTROLLER PLACEMENT IN A THREE-DIMENSIONAL (3D) INTEGRATED CIRCUIT (IC) (3DIC) EMPLOYING DISTRIBUTED THROUGH-SILICON-VIA (TSV) FARMS

BACKGROUND

I. Field of the Disclosure

The technology of the disclosure relates generally to three-dimensional (3D) integrated circuits (ICs) (3DICs).

II. Background

Computing devices such as smartphones have become common in modern society. The prevalence of computing devices may be attributed to the many functions that are enabled within such computing devices. Increasingly complex integrated circuits (ICs) have been designed and manufactured to provide increasingly greater functionality in the computing devices. Concurrent with the increases in complexity of the ICs, there has been pressure to decrease footprint of the ICs. In a traditional two-dimensional (2D) IC (2DIC), all electrical components such as processor cores, memory chips, and logic circuits are disposed in a single semiconductor IC tier. Memory controllers are typically placed near input/output (I/O) pins of the memory chips to reduce memory access latency. However, as complexity of the IC grows, it becomes increasingly difficult to achieve footprint and latency reductions at the same time in a 2DIC.

A three-dimensional (3D) IC (3DIC) addresses design challenges of the 2DIC by stacking up multiple semiconductor IC tiers in an integrated semiconductor die. To provide electrical interconnections between the multiple semiconductor IC tiers, a plurality of through-silicon-vias (TSVs), which is collectively often referred to as a TSV farm, is provided in the 3DIC. To reduce interconnection delays, the TSV farm is typically disposed in the center of the 3DIC to provide shortest-possible wiring distances between electrical components in the 3DIC.

In this regard, FIG. 1 is a schematic diagram illustrating a top view of a TSV farm 10 disposed in the center of a 3DIC 12. The 3DIC 12 includes a plurality of semiconductor IC tiers 14(1)-14(N). The TSV farm 10 comprises a plurality of TSVs 16 crossing each of the plurality of semiconductor IC tiers 14(1)-14(N). The TSVs 16 are used to provide interconnections between circuits of different semiconductor IC tiers 14(1)-14(N) in the 3DIC 12. In this example, a memory IC 18 is disposed in at least one of the plurality of semiconductor IC tiers 14(1)-14(N) for the 3DIC 12 used as a system-on-a-chip (SOC). The memory IC 18 may be a memory array containing bitcells that can store data. A memory controller 20 is also disposed on a semiconductor IC tier 14(N), for example, that is configured to service memory access requests to the memory IC 18. The TSV farm 10 is placed at a geometric center 22 of the 3DIC 12 to reduce interconnect latencies between the plurality of semiconductor IC tiers 14(1)-14(N). However, if the memory controller 20 and the memory IC 18 are placed apart from each other in the same semiconductor IC tier 14(X) (1≤X≤N), a memory bus 24 connecting the memory controller 20 and the memory IC 18 must be routed around the TSV farm 10. As the wire-length between the memory controller 20 and the memory IC 18 increases, memory access latency and thermo mechanical reliability (TMR) of the 3DIC 12 both deteriorate as a result. To minimize memory access latency of memory access requests to the memory IC 18, the memory controller 20 should be physically located as close to the memory IC 18 as possible, thus adding constraints to IC design.

SUMMARY OF THE DISCLOSURE

Aspects disclosed in the detailed description include memory controller placement in a three-dimensional (3D) integrated circuit (IC) (3DIC) employing distributed through-silicon-via (TSV) farms. The distributed TSV farms provide interconnections between circuits in different semiconductor IC tiers of the 3DIC. The 3DIC may be provided as a system-on-a chip (SOC) in which a memory system is provided in the 3DIC and accessed by other circuits, such as a central processing unit (CPU) or processor core, for data storage and retrieval. Providing distributed TSV farms in a 3DIC may achieve improved performance, power, and area (PPA) objectives and thermo mechanical reliability (TMR) of the 3DIC, as opposed to a centralized TSV farm that involves more complex intra-tier routing around the TSV farm. However, providing distributed TSV farms makes memory controller placement more challenging, because it is generally desired to place the memory controller as close as possible to the TSV farm to minimize latency of memory access requests from other tiers through the TSV farm to the memory controller.

In this regard, in one aspect, a memory controller is disposed in a 3DIC based on a centralized placement scheme within a distributed TSV farm. The memory controller can be placed at a geometric center within multiple TSV farms to provide an approximately equal wire-length between the memory controller and each of the multiple TSV farms. In another aspect, multiple memory controllers are provided in a 3DIC based on a distributed placement scheme, in which each of the multiple memory controllers is placed adjacent to a respective TSV farm among the multiple TSV farms. By disposing the memory controller(s) based on the centralized placement scheme and/or the distributed placement scheme in the 3DIC, latency of memory access requests is minimized by the memory controller(s) being located adjacent to the distributed TSV farms while avoiding a single centralized TSV farm that provides for more complex intra-tier routing around the TSV farm.

In this regard in one aspect, a 3DIC is provided. The 3DIC comprises a plurality of semiconductor IC tiers. The 3DIC also comprises a memory controller circuit disposed in a semiconductor IC tier among the plurality of semiconductor IC tiers and coupled to one or more memory buses. The 3DIC also comprises at least one processor core disposed in at least one of the plurality of semiconductor IC tiers and communicatively coupled to the memory controller circuit. The 3DIC also comprises at least one memory IC disposed in at least one of the plurality of semiconductor IC tiers. The 3DIC also comprises a plurality of distributed TSV farms each configured to electrically interconnect the plurality of semiconductor IC tiers, wherein each of the plurality of distributed TSV farms comprises a plurality of TSVs. The 3DIC also comprises one or more memory-access TSV farms selected from the plurality of distributed TSV farms and configured to provide interconnections to the at least one memory IC. Each of the one or more memory buses is connected to the at least one memory IC through a respective memory-access TSV farm among the one or more memory-access TSV farms. The memory controller circuit is configured to service memory access requests between the at least one processor core and the at least one memory IC.

In another aspect, a 3DIC means is provided. The 3DIC means comprises a plurality of semiconductor IC tiers. The 3DIC means also comprises a means for controlling memory disposed in at least one of the plurality of semiconductor IC tiers and coupled to one or more memory buses. The 3DIC means also comprises at least one means for processing disposed in at least one of the plurality of semiconductor IC tiers and communicatively coupled to the means for controlling memory. The 3DIC means also comprises at least one means for storing data disposed in at least one of the plurality of semiconductor IC tiers. The 3DIC means also comprises a plurality of means for electrically interconnecting the plurality of semiconductor IC tiers, wherein each of the plurality of means for electrically interconnecting the plurality of semiconductor IC tiers comprises one or more TSVs. The 3DIC means also comprises one or more means for accessing memory selected from the plurality of means for electrically interconnecting the plurality of semiconductor IC tiers and configured to provide interconnections to the at least one means for storing data. Each of the one or more memory buses is connected to the at least one means for storing data through a respective means for accessing memory among the one or more means for accessing memory. The means for controlling memory is configured to service memory access requests between the at least one means for processing and the at least one means for storing data.

In another aspect, a method for placing memory controllers in a 3DIC employing distributed TSV farms is provided. The method comprises disposing at least one memory IC in at least one of a plurality of semiconductor IC tiers. The method also comprises determining one or more memory-access TSV farms among a plurality of distributed TSV farms employed by a 3DIC based on placement of the at least one memory IC, wherein the one or more memory-access TSV farms is configured to provide interconnections to the at least one memory IC across the plurality of semiconductor IC tiers. The method also comprises disposing a memory controller circuit in at least one of the plurality of semiconductor IC tiers of the 3DIC. The method also comprises coupling one or more memory buses to the at least one memory IC through the one or more memory-access TSV farms, wherein each of the one or more memory-access TSV farms comprises a respective memory bus among the one or more memory buses. The method also comprises coupling the memory controller circuit to the one or more memory buses. The method also comprises communicatively coupling the memory controller circuit to at least one processor core in the 3DIC. The method also comprises configuring the memory controller circuit to service memory access requests between the at least one processor core and the at least one memory IC.

DETAILED DESCRIPTION

Figure 1:
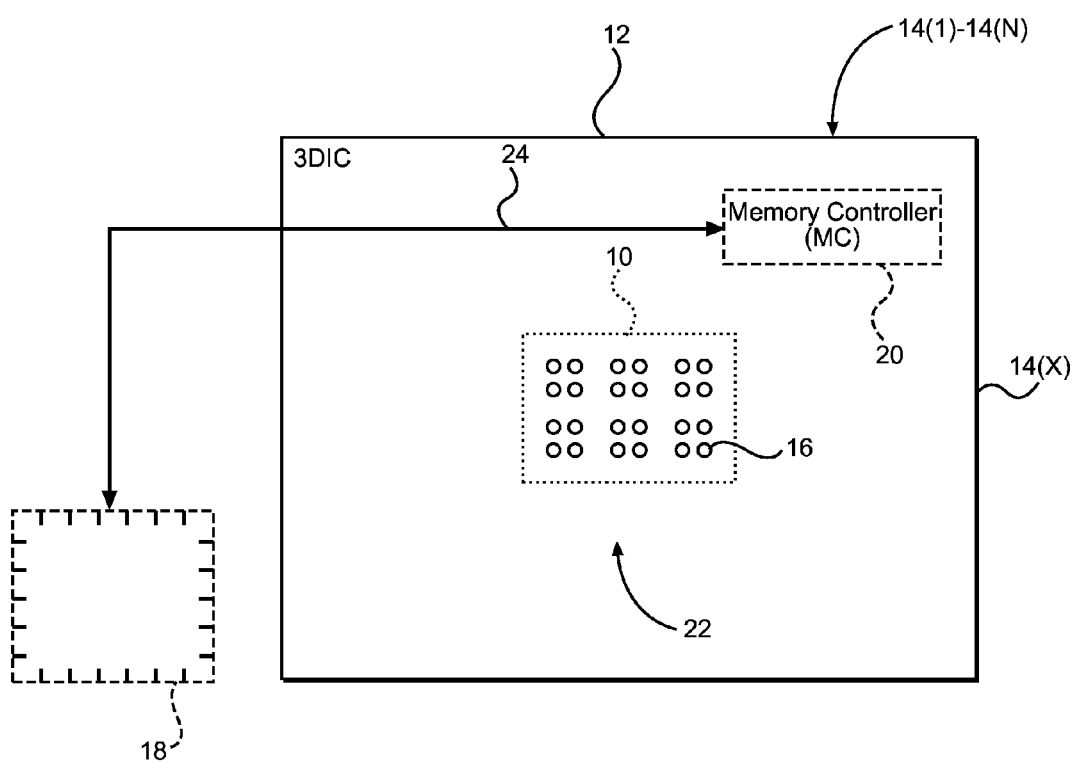
FIG. 1 is a schematic diagram illustrating a top view of a through-silicon-via (TSV) farm disposed in a geometric center of a three-dimensional (3D) integrated circuit (IC) (3DIC) that comprises a plurality of semiconductor IC tiers.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include memory controller placement in a three-dimensional (3D) integrated circuit (IC) (3DIC) employing distributed through-silicon-via (TSV) farms. The distributed TSV farms provide interconnections between circuits in different semiconductor IC tiers of the 3DIC. The 3DIC may be provided as a system-on-a chip (SOC) in which a memory system is provided in the 3DIC and accessed by other circuits, such as a central processing unit (CPU) or processor core, for data storage and retrieval. Providing distributed TSV farms in a 3DIC may achieve improved performance, power, and area (PPA) objectives and thermo mechanical reliability (TMR) of the 3DIC, as opposed to a centralized TSV farm that involves more complex intra-tier routing around the TSV farm. However, providing distributed TSV farms makes memory controller placement more challenging, because it is generally desired to place the memory controller as close as possible to the TSV farm to minimize latency of memory access requests from other tiers through the TSV farm to the memory controller.

In this regard, in one aspect, a memory controller is disposed in a 3DIC based on a centralized placement scheme within a distributed TSV farm. The memory controller can be placed at a geometric center within multiple TSV farms to provide an approximately equal wire-length between the memory controller and each of the multiple TSV farms. In another aspect, multiple memory controllers are provided in a 3DIC based on a distributed placement scheme, in which each of the multiple memory controllers is placed adjacent to a respective TSV farm among the multiple TSV farms. By disposing the memory controller(s) based on the centralized placement scheme and/or the distributed placement scheme in the 3DIC, latency of memory access requests is minimized by the memory controller(s) being located adjacent to the distributed TSV farms while avoiding a single centralized TSV farm that provides for more complex intra-tier routing around the TSV farm.

Figure 2:
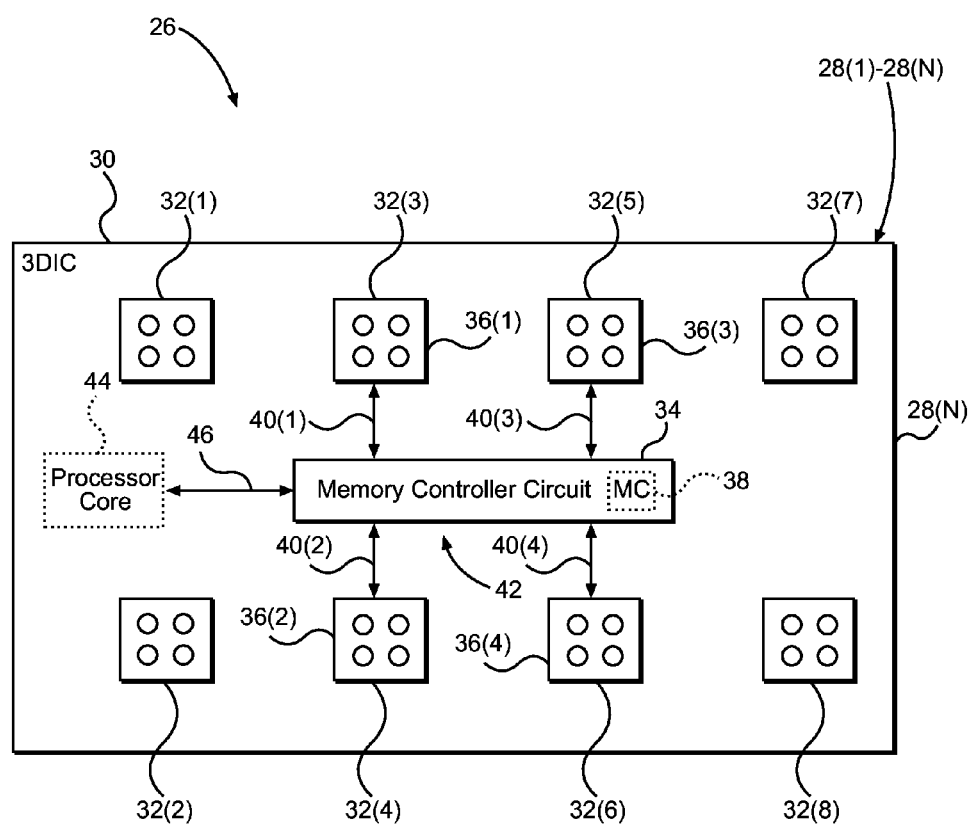
FIG. 2 is a schematic diagram illustrating an exemplary top view of a centralized memory controller placement scheme in a 3DIC employing a plurality of distributed TSV farms.

In this regard, FIG. 2 is a schematic diagram illustrating an exemplary top view of a centralized memory controller placement scheme 26 in a semiconductor IC tier 28(N) among a plurality of semiconductor IC tiers 28(1)-28(N) in a 3DIC 30. The 3DIC 30 employs a plurality of distributed TSV farms 32(1)-32(8) and has a memory controller circuit 34 disposed among one or more memory-access TSV farms 36(1)-36(4) selected from the plurality of distributed TSV farms 32(1)-32(8) and configured to provide interconnections to a memory IC (not shown) in the 3DIC 30. In a non-limiting example, the memory IC may be a dynamic random access memory (DRAM), a resistive random access memory (RRAM), a universal flash storage (UFS), or an embedded multimedia card (eMMC). The 3DIC 30 may comprise any positive integer number of distributed TSV farms 32 and any positive integer number of memory-access TSV farms 36. The plurality of distributed TSV farms 32(1)-32(8) and the one or more memory-access TSV farms 36(1)-36(4) in the 3DIC 30 are provided as a non-limiting example and for the convenience of discussion.

With reference to FIG. 2, the memory controller circuit 34, which comprises a memory controller (MC) 38, is coupled to one or more memory buses 40(1)-40(4) that interconnect to the memory IC through the one or more memory-access TSV farms 36(1)-36(4), respectively. In this regard, each of the one or more memory-access TSV farms 36(1)-36(4) comprises a respective memory bus 40 among the one or more memory buses 40(1)-40(4). In this non-limiting example, the memory controller circuit 34 is placed at a geometric center 42 that has approximately equal distance (e.g., wire-length) to the one or more memory-access TSV farms 36(1)-36(4), thus achieving approximately equal access latency among the one or more memory-access TSV farms 36(1)-36(4). The memory controller circuit 34 is communicatively coupled to at least one processor core 44 through a second shared bus 46. The memory controller circuit 34 receives memory access requests from the processor core 44 and dynamically selects at least one memory bus 40 among the one or more memory buses 40(1)-40(4) to service the memory access requests received from the processor core 44. In this non-limiting example, the memory controller circuit 34 may act as an arbiter and select a memory bus 40 among the one or more memory buses 40(1)-40(4) to service the memory access requests based on load conditions among the one or more memory buses 40(1)-40(4). The memory controller circuit 34 is further configured to provide memory access results received from the one or more memory buses 40(1)-40(4) to the processor core 44 via the second shared bus 46. By placing the memory controller circuit 34 at the geometric center 42, the memory IC may be placed in a semiconductor IC tier 28(X) (1≤X<N), thus providing more flexibility in designing the 3DIC 30.

Figure 3:
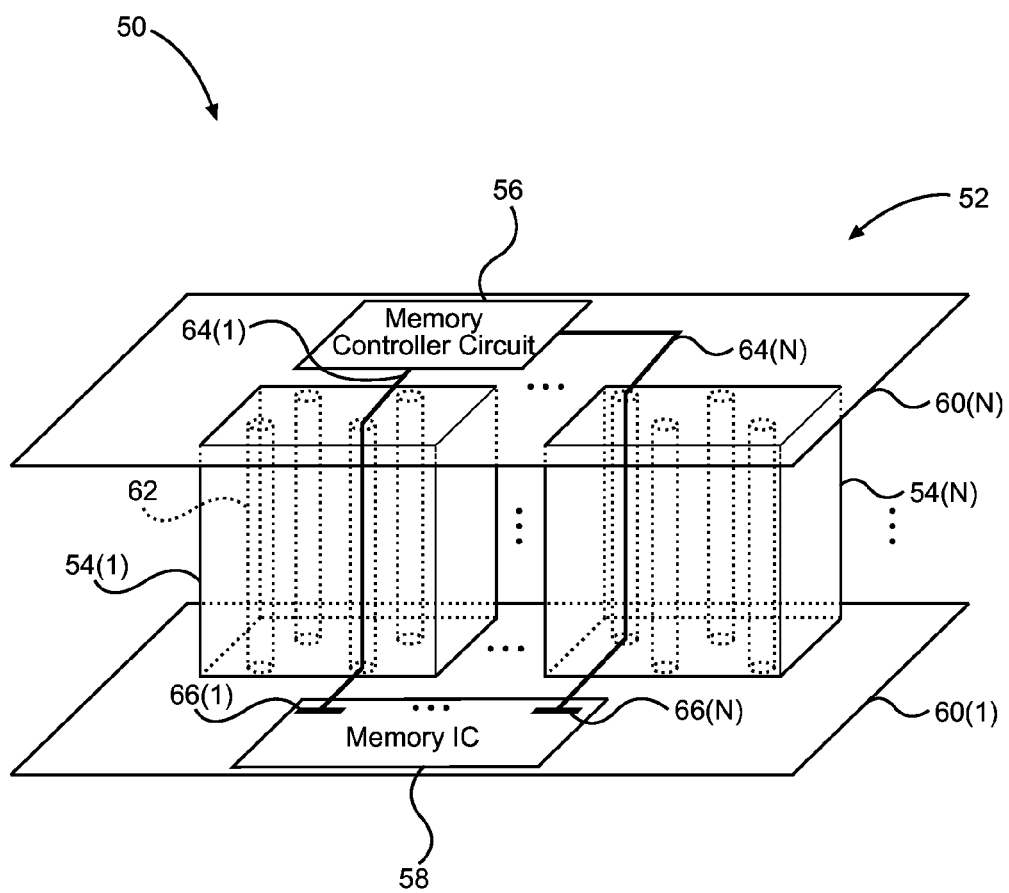
FIG. 3 is a schematic diagram of an exemplary 3D view of a centralized memory controller placement scheme in a 3DIC comprising one or more memory-access TSV farms configured to interconnect a memory controller circuit and at least one memory IC across a plurality of semiconductor IC tiers.

In this regard, FIG. 3 is a schematic diagram of an exemplary 3D view of a centralized placement scheme 50 in a 3DIC 52 comprising one or more memory-access TSV farms 54(1)-54(N) configured to interconnect a memory controller circuit 56 and at least one memory IC 58 across a plurality of semiconductor IC tiers 60(1)-60(N).

With reference to FIG. 3, each of the one or more memory-access TSV farms 54(1)-54(N) may comprise one or more TSVs 62. In a non-limiting example, each of the one or more memory-access TSV farms 54(1)-54(N) may comprise the same number of TSVs 62 or a different number of TSVs 62. One or more memory buses 64(1)-64(N) couple the memory controller circuit 56 to the memory IC 58. Each of the one or more memory buses 64(1)-64(N) is disposed through a respective memory-access TSV farm 54 among the one or more memory-access TSV farms 54(1)-54(N).

With continuing reference to FIG. 3, the memory IC 58 comprises a plurality of connection pins (not shown) that are divided into one or more connection pin clusters 66(1)-66(N). Each of the one more connection pin clusters 66(1)-66(N) comprises at least one connection pin (not shown). In a non-limiting example, the one or more connection pin clusters 66(1)-66(N) are configured to each have the same number of connection pins. For example, if the memory IC 58 is a wide-input-output (Wide-IO) type-2 (Wide-IO 2) memory IC, one thousand twenty-four (1024) connection pins are provided by the memory IC 58. If the memory IC 58 is configured to divide the 1024 connection pins evenly into eight (8) connection pin clusters 66(1)-66(8), each connection pin cluster 66 will then consist of one hundred twenty-eight (128) connection pins. Each of the one or more connection pin clusters 66(1)-66(N) is coupled to a respective memory bus 64 among the one or more memory buses 64(1)-64(N). Hence, the memory IC 58 may be accessed simultaneously for read and/or write operations via the one or more memory buses 64(1)-64(N).

Figure 4:
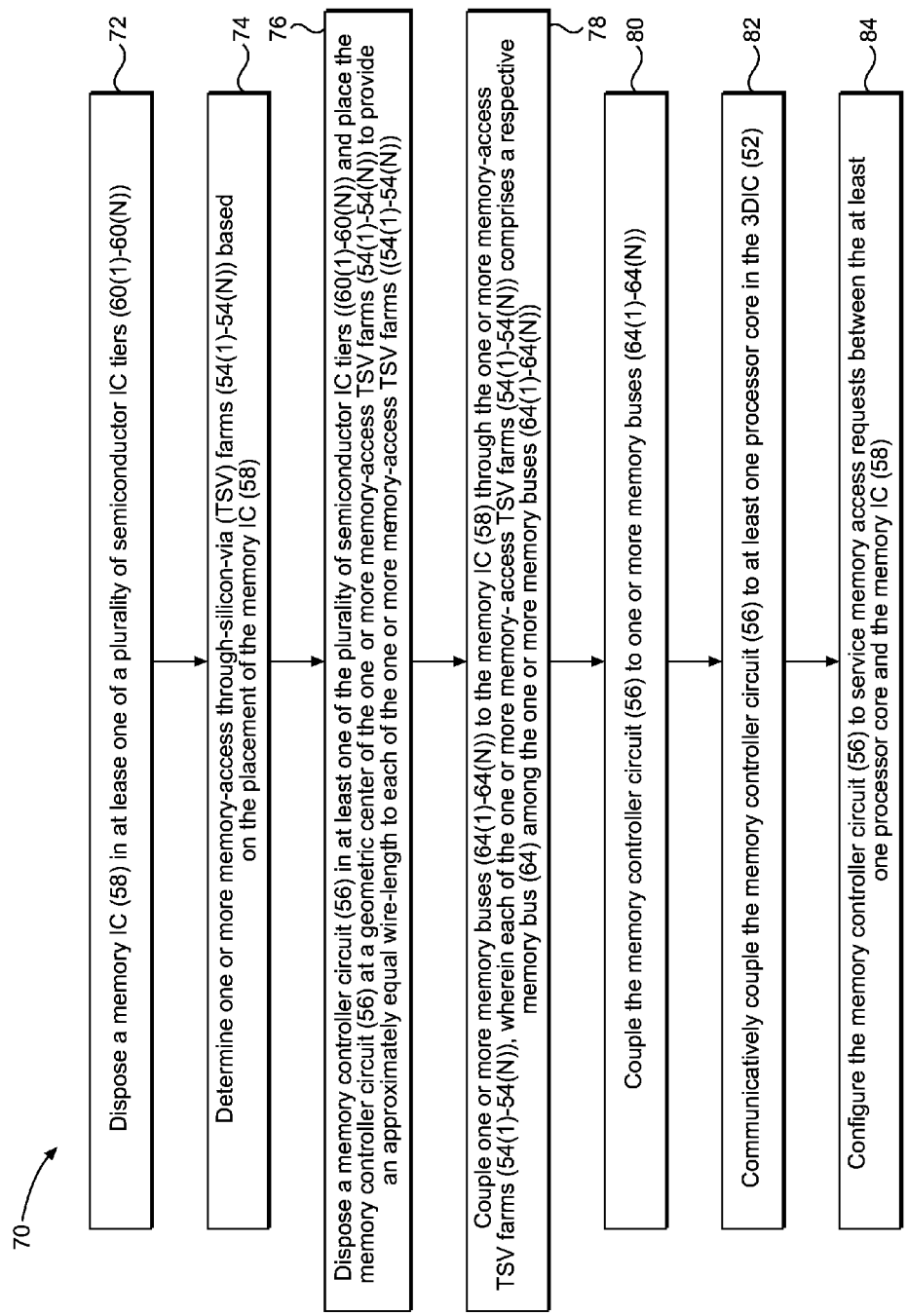
FIG. 4 is a flowchart of an exemplary centralized memory controller placement process for placing the memory controller circuit in the 3DIC of FIG. 3 for memory access.

FIG. 4 is a flowchart of an exemplary centralized memory controller placement process 70 for placing the memory controller circuit 56 in the 3DIC 52 of FIG. 3 for memory access. Elements in FIG. 3 are referenced in connection with FIG. 4 and will not be re-described herein.

According to the centralized memory controller placement process 70, the memory IC 58 is disposed in at least one of the plurality of semiconductor IC tiers 60(1)-60(N) (block 72). Next, the one or more memory-access TSV farms 54(1)-54(N) are determined based on the placement of the memory IC 58 (block 74). The memory controller circuit 56 is then disposed in at least one of the plurality of semiconductor IC tiers 60(1)-60(N) and placed at a geometric center of the one or more memory-access TSV farms 54(1)-54(N) to provide an approximately equal wire-length to each of the one or more memory-access TSV farms 54(1)-54(N) (block 76). Subsequently, the one or more memory buses 64(1)-64(N) are coupled to the memory IC 58 through the one or more memory-access TSV farms 54(1)-54(N), wherein each of the one or more memory-access TSV farms 54(1)-54(N) comprises a respective memory bus 64 among the one or more memory buses 64(1)-64(N) (block 78). Next, the memory controller circuit 56 is coupled to the one or more memory buses 64(1)-64(N) (block 80). The memory controller circuit 56 is then communicatively coupled to at least one processor core in the 3DIC 52 (block 82). Finally, the memory controller circuit 56 is configured to service memory access requests between the at least one processor core and the memory IC 58 (block 84).

Figure 5:
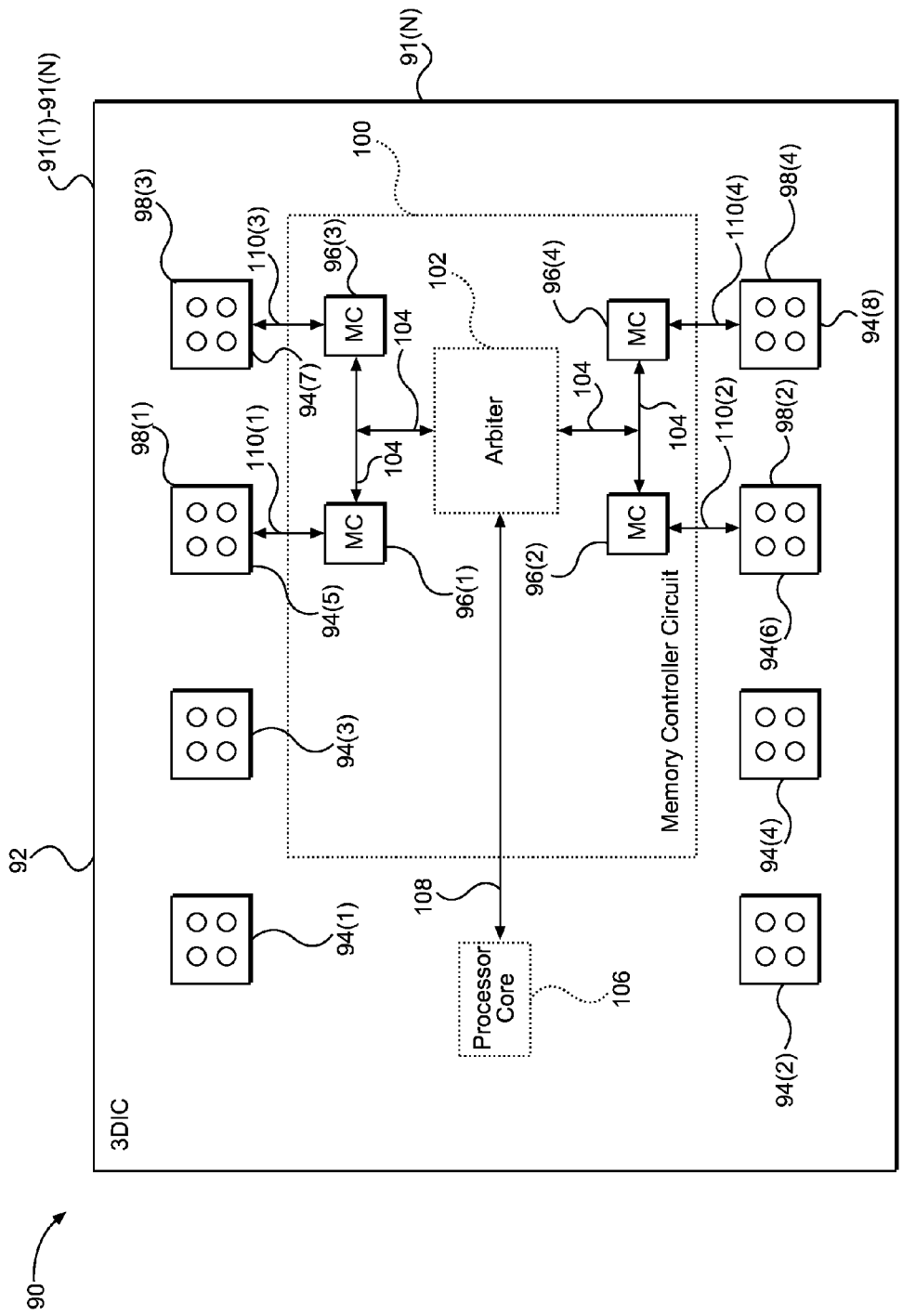
FIG. 5 is a schematic diagram illustrating an exemplary top view of a distributed memory controller placement scheme in a semiconductor IC tier among a plurality of semiconductor IC tiers in a 3DIC.

As previously discussed in FIG. 2, the centralized memory controller placement scheme 26 requires that the memory controller circuit 34 to provide memory access simultaneously through the one or more memory-access TSV farms 36(1)-36(4). As such, the centralized memory controller placement scheme 26 is easier to support in a complex 3DIC design. However, in some 3DIC designs, it may be desirable to minimize memory access latency in designing a memory controller placement scheme. In this regard, FIG. 5 is a schematic diagram illustrating an exemplary top view of a distributed memory controller placement scheme 90 in a semiconductor IC tier 91(N) among a plurality of semiconductor IC tiers 91(1)-91(N) in a 3DIC 92. The 3DIC 92 employs a plurality of distributed TSV farms 94(1)-94(8) and has one or more memory controllers 96(1)-96(4) respectively coupled to one or more memory-access TSV farms 98(1)-98(4) selected from the plurality of distributed TSV farms 94(1)-94(8) and configured to provide interconnections to a memory IC (not shown) in the 3DIC 92. In a non-limiting example, the memory IC may be a dynamic random access memory (DRAM), a resistive random access memory (RRAM), a universal flash storage (URS), or an embedded multimedia card (eMMC). The memory IC may be placed in a semiconductor IC tier 91(X) (1≤X≤N) (not shown) among the plurality of semiconductor IC tiers 91(1)-91(N). The 3DIC 92 may comprise any positive integer number of distributed TSV farms 94 and any positive integer number of memory-access TSV farms 98. The plurality of distributed TSV farms 94(1)-94(8) and the one or more memory-access TSV farms 98(1)-98(4) in the 3DIC 92 are provided as a non-limiting example and for the convenience of discussion.

With continuing reference to FIG. 5, in a non-limiting example, the one or more memory controllers 96(1)-96(4) may be provided in a memory controller circuit 100. The memory controller circuit 100 may comprise an arbiter 102 that is communicatively coupled to the one or more memory controllers 96(1)-96(4) via a first shared bus 104. The arbiter 102 is also coupled to at least one processor core 106 via a second shared bus 108. The at least one processor core 106 may be placed in a semiconductor IC tier 91(Y) (1≤Y≤N) (not shown) among the plurality of semiconductor IC tiers 91(1)-91(N). In a non-limiting example, the processor core 106 may be configured to assume functionalities of the arbiter 102. In another non-limiting example, at least one of the one or more memory controllers 96(1)-96(4) may be configured to act as the arbiter 102.

With continuing reference to FIG. 5, the one or more memory controllers 96(1)-96(4) are respectively coupled to one or more memory buses 110(1)-110(4). The one or more memory buses 110(1)-110(4) connect to the memory IC through the one or more memory-access TSV farms 98(1)-98(4), respectively. In this regard, each of the one or more memory-access TSV farms 98(1)-98(4) comprises a respective memory bus 110 among the one or more memory buses 110(1)-110(4). Hence, the one or more memory controllers 96(1)-96(4) are coupled to the memory IC through the one or more memory-access TSV farms 98(1)-98(4), respectively. Furthermore, each of the one or more memory controllers 96(1)-96(4) is placed adjacent to a respective memory-access TSV farm 98 among the one or more memory-access TSV farms 98(1)-98(4). For example, memory controller 96(1) is placed adjacent to memory-access TSV farm 98(1), memory controller 96(2) is placed adjacent to memory-access TSV farm 98(2), and so on. Such placement minimizes the distances (e.g., wire-lengths) between the one or more memory controllers 96(1)-96(4) and the memory IC, thus helping to reduce access latency to the memory IC.

With continuing reference to FIG. 5, the arbiter 102 is configured to service memory access requests between the processor core 106 and the memory IC. Specifically, when a memory access request (not shown) is received from the processor core 106, the arbiter 102 dynamically selects at least one memory controller 96 among the one or more memory controllers 96(1)-96(4) to service the memory access request. In a non-limiting example, the arbiter 102 may make a selection among the one or more memory controllers 96(1)-96(4) based on load conditions of the one or more memory controllers 96(1)-96(4) and the nature of the memory access request. The arbiter 102 then provides the memory access request to the selected memory controller 96, and provides memory access results received from the selected memory controller 96 to the processor core 106. When more than one of the one or more memory controllers 96(1)-96(4) are attempting to send the memory access results to the arbiter 102 over the first shared bus 104, the arbiter 102 is also configured to arbitrate access to the first shared bus 104 by the one or more memory controllers 96(1)-96(4).

Figure 6:
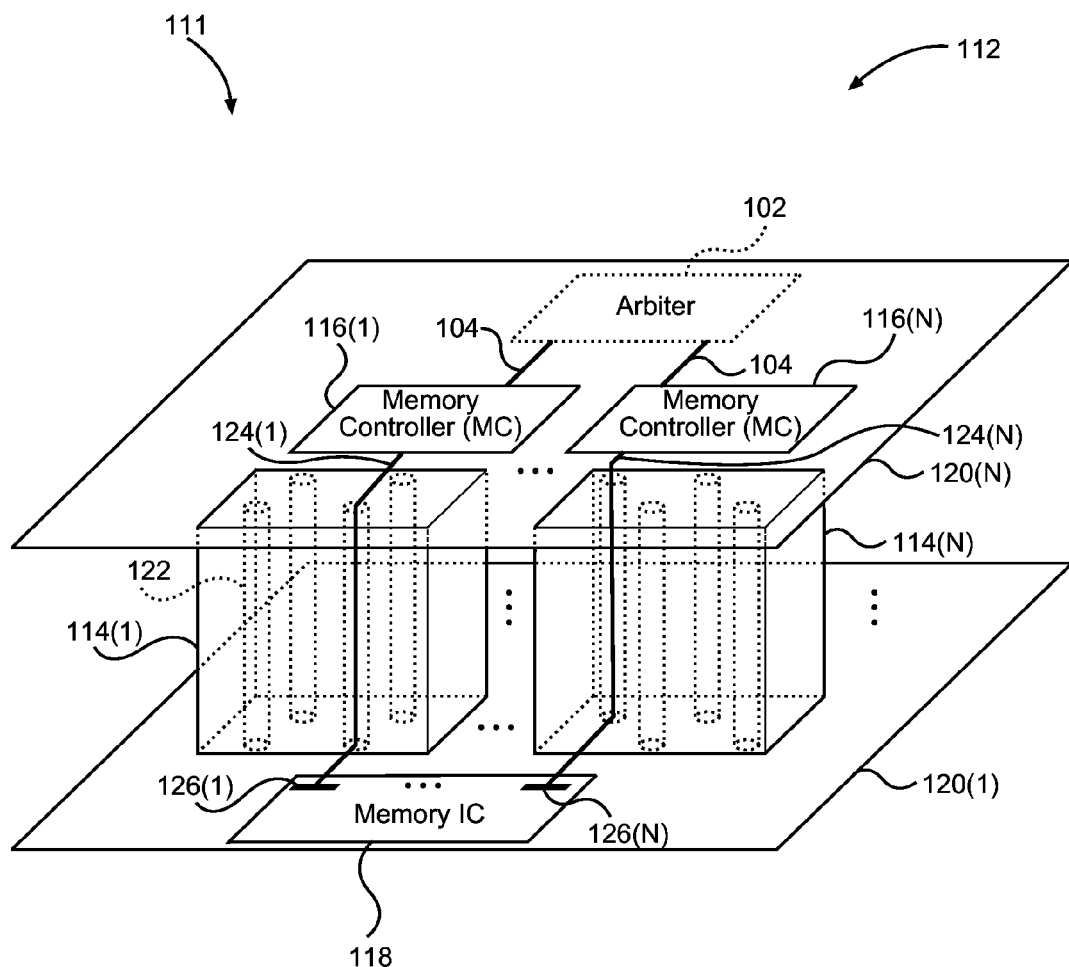
FIG. 6 is a schematic diagram of an exemplary 3D view of a distributed memory controller placement scheme in a 3DIC comprising one or more memory-access TSV farms configured to interconnect one or more memory controllers and at least one memory IC across a plurality of semiconductor IC tiers.

In the 3DIC 92, it is possible that the one or more memory controllers 96(1)-96(4) and the memory IC are disposed in different semiconductor IC tiers 91(1)-91(N). In this regard, FIG. 6 is a schematic diagram of an exemplary 3D view of a distributed memory controller placement scheme 111 in a 3DIC 112 comprising one or more memory-access TSV farms 114(1)-114(N) configured to interconnect one or more memory controllers 116(1)-116(N) and at least one memory IC 118 across a plurality of semiconductor IC tiers 120(1)-120(N). Elements in FIG. 5 are referenced in connection with FIG. 6 and will not be re-described herein.

With reference to FIG. 6, each of the one or more memory-access TSV farms 114(1)-114(N) may comprise one or more TSVs 122. In a non-limiting example, each of the one or more memory-access TSV farms 114(1)-114(N) may comprise the same number of TSVs 122 or a different number of TSVs 122. One or more memory buses 124(1)-124(N) couple the one or more memory controllers 116(1)-116(N) to the memory IC 118. Each of the one or more memory buses 124(1)-124(N) is disposed through a respective memory-access TSV farm 114 among the one or more memory-access TSV farms 114(1)-114(N). The arbiter 102 is communicatively coupled to the one or more memory controllers 116(1)-116(N) via the first shared bus 104. Although the arbiter 102 is shown in the semiconductor IC tier 120(N) in FIG. 6, the arbiter 102 may be disposed in any of the plurality of semiconductor IC tiers 120(1)-120(N).

With continuing reference to FIG. 6, the memory IC 118 comprises a plurality of connection pins (not shown) that are divided into one or more connection pin clusters 126(1)-126(N). In a non-limiting example, the memory IC 118 is the same as the memory IC 58 in FIG. 3. Likewise, the one or more connection pin clusters 126(1)-126(N) are the same as the one or more connection pin clusters 66(1)-66(N) in FIG. 3. Each of the one or more connection pin clusters 126(1)-126(N) comprises at least one connection pin. In a non-limiting example, the one or more connection pin clusters 126(1)-126(N) are configured to each have the same number of connection pins. For example, if the memory IC 118 is a Wide-IO 2 memory IC, 1024 connection pins will be available in the memory IC 118. If the memory IC 118 is configured to divide the 1024 connection pins evenly into eight (8) connection pin clusters 126(1)-126(8), each connection pin cluster 126 will then consist of 128 connection pins. Each of the one or more connection pin clusters 126(1)-126(N) is coupled to a respective memory bus 124 among the one or more memory buses 124(1)-124(N). Hence, the memory IC 118 may be accessed simultaneously for read and/or write operations via the one or more memory buses 124(1)-124(N).

Figure 7:
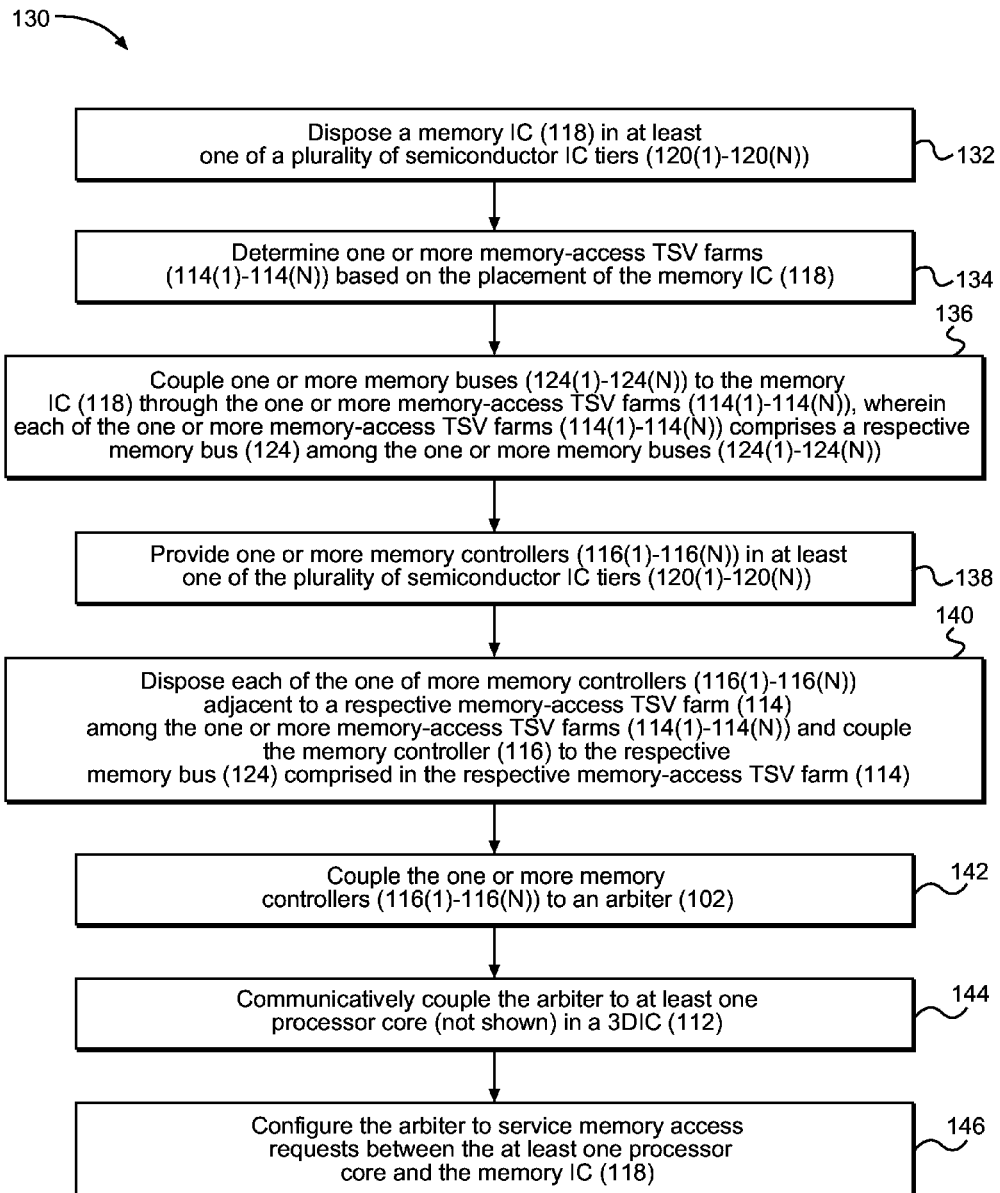
FIG. 7 is a flowchart of an exemplary memory controller distributed placement process for placing the one or more memory controllers in the 3DIC for memory access based on the distributed memory controller placement scheme of FIG. 6.

FIG. 7 is a flowchart of an exemplary distributed memory controller placement process 130 for placing the one or more memory controllers 116(1)-116(N) in the 3DIC 112 for memory access based on the distributed memory controller placement scheme 111 of FIG. 6. Elements in FIG. 6 are referenced in connection with FIG. 7 and will not be re-described herein.

According to the distributed memory controller placement process 130, the memory IC 118 is disposed in at least one of the plurality of semiconductor IC tiers 120(1)-120(N) (block 132). Next, the one or more memory-access TSV farms 114(1)-114(N) are determined based on the placement of the memory IC 118 (block 134). Subsequently, the one or more memory buses 124(1)-124(N) are coupled to the memory IC 118 through the one or more memory-access TSV farms 114(1)-114(N), wherein each of the one or more memory-access TSV farms 114(1)-114(N) comprises a respective memory bus 124 among the one or more memory buses 124(1)-124(N) (block 136). As previously discussed with reference to FIG. 6, the one or more memory buses 124(1)-124(N) are coupled to the one or more connection pin clusters 126(1)-126(N) of the memory IC 118, respectively. The one or more memory controllers 116(1)-116(N) are then provided in at least one of the plurality of semiconductor IC tiers 120(1)-120(N) (block 138). Each of the one or more memory controllers 116(1)-116(N) is disposed adjacent to a respective memory-access TSV farm 114 among the one or more memory-access TSV farms 114(1)-114(N) and the memory controller 116 is thus coupled to the respective memory bus 124 comprised in the respective memory-access TSV farm 114 (block 140). The one or more memory controllers 116(1)-116(N) are then coupled to the arbiter 102 (block 142). The arbiter is then communicatively coupled to at least one processor core (not shown) in the 3DIC 112 (block 144). Finally, the arbiter is configured to service memory access requests between the processor core and the memory IC 118 (block 146).

Figure 8:
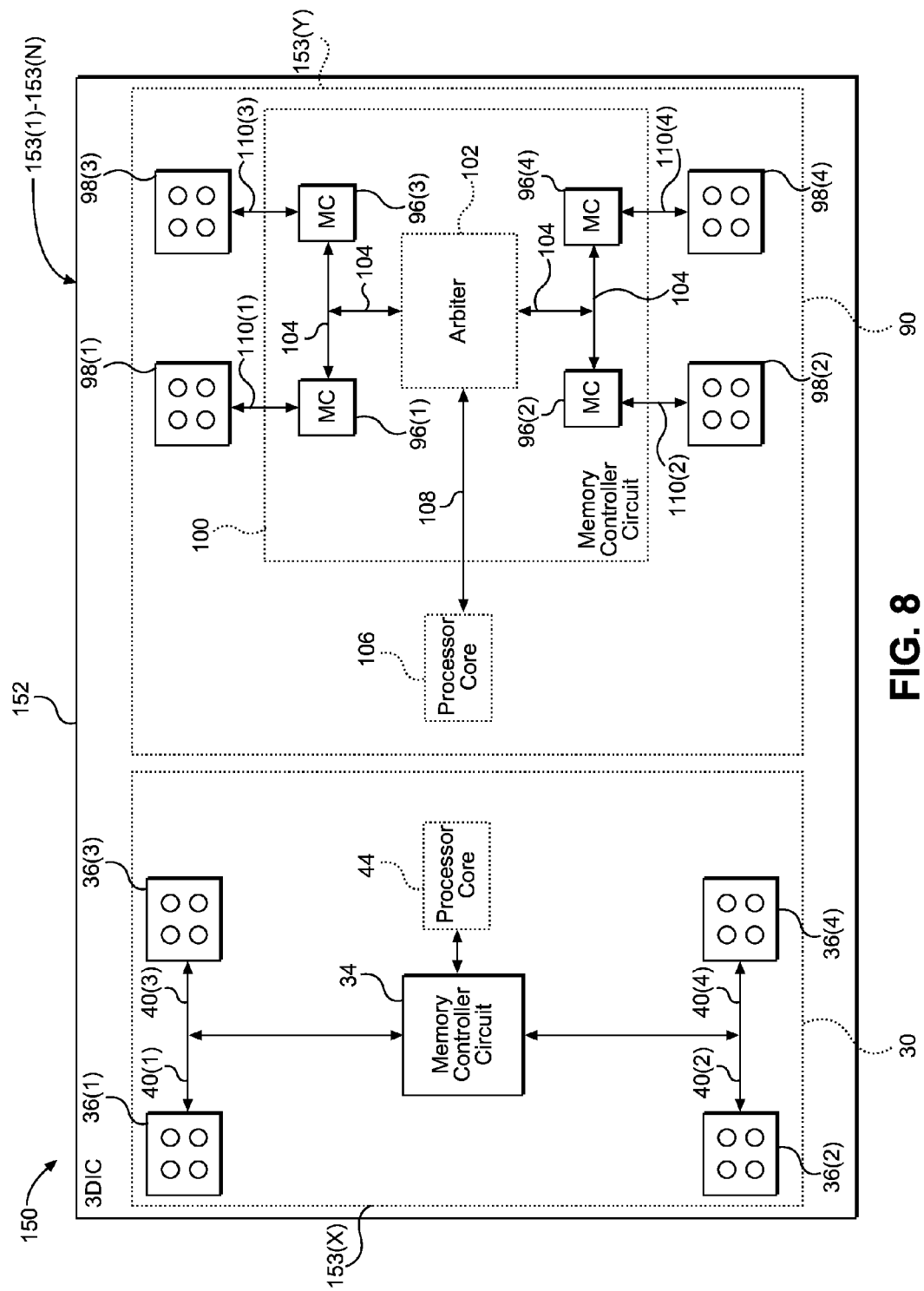
FIG. 8 is a schematic diagram of an exemplary top view of a hybrid memory controller placement scheme comprising the centralized placement scheme of FIG. 2 and the distributed placement scheme of FIG. 5 in a 3DIC.

As previously discussed, it is easier to support the centralized memory controller placement scheme 26 in FIG. 2 in a complex 3DIC design because the centralized memory controller placement scheme 26 requires only a single memory controller to function. Also as previously discussed, the distributed memory controller placement scheme 90 of FIG. 5 can help reduce memory access latency by employing multiple memory controllers. However, a complex system-on-chip (SoC) 3DIC may include many functional sub-systems with varied design requirements. For example, some functional sub-systems may impose stringent memory latency budgets, which are better served by the distributed memory controller placement scheme 90, while others may mandate a tighter footprint that are more catered to by the centralized memory controller placement scheme 26 of FIG. 2. In this regard, FIG. 8 is a schematic diagram of an exemplary top view of a hybrid memory controller placement scheme 150 comprising the centralized memory controller placement scheme 26 of FIG. 2 and the distributed memory controller placement scheme 90 of FIG. 5 in a 3DIC 152. Common elements between FIGS. 2, 5, and 8 are shown with common element numbers, and thus will not be re-described herein.

With reference to FIG. 8, the 3DIC 152 comprises a plurality of semiconductor IC tiers 153(1)-153(N). The centralized memory controller placement scheme 26 may be employed in a semiconductor IC tier 153(X) ($1 \leq X \leq N$) and the distributed memory controller placement scheme 90 may be employed in a semiconductor IC tier 153(Y) ($1 \leq Y \leq N$). In a non-limiting example, the processor core 44 and the processor core 106 (also referred to herein as "the second processor core") may be the same processor core. In another non-limiting example, the one or more memory-access TSV farms 36(1)-36(4) may also be the one or more memory-access TSV farms 98(1)-98(4) (also referred to herein as "the one or more second memory-access TSV farms"). In another non-limiting example, the memory controller circuit 34 and the memory controller circuit 100 (also referred to herein as "the second memory controller circuit") may be the same memory controller circuit. In another non-limiting example, the one or more memory buses 40(1)-40(4) and the one or more memory buses 110(1)-110(4) (also referred to herein as "the one or more second memory buses") may be the same one or more memory buses. In another non-limiting example, the memory IC (not shown) of FIG. 2 and the memory IC (not shown) of FIG. 5 (also referred to herein as "the at least one second memory IC") may be the same memory IC. In yet another non-limiting example, one of the one or more memory controllers 96(1)-96(4) in the distributed memory controller placement scheme 90 may be configured to serve as the memory controller circuit 34 in the centralized memory controller placement scheme 26.

The 3DIC 30 that employs the centralized memory controller placement scheme 26 in FIG. 2, the 3DIC 92 that employs the distributed memory controller placement scheme 90 in FIG. 5, or the 3DIC 152 that employs the hybrid memory controller placement scheme 150 in FIG. 8 may be provided in or integrated into any processor-based device. Examples, without limitation, include: a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, a threshold logic circuit, and a logic process circuit.

Figure 9:
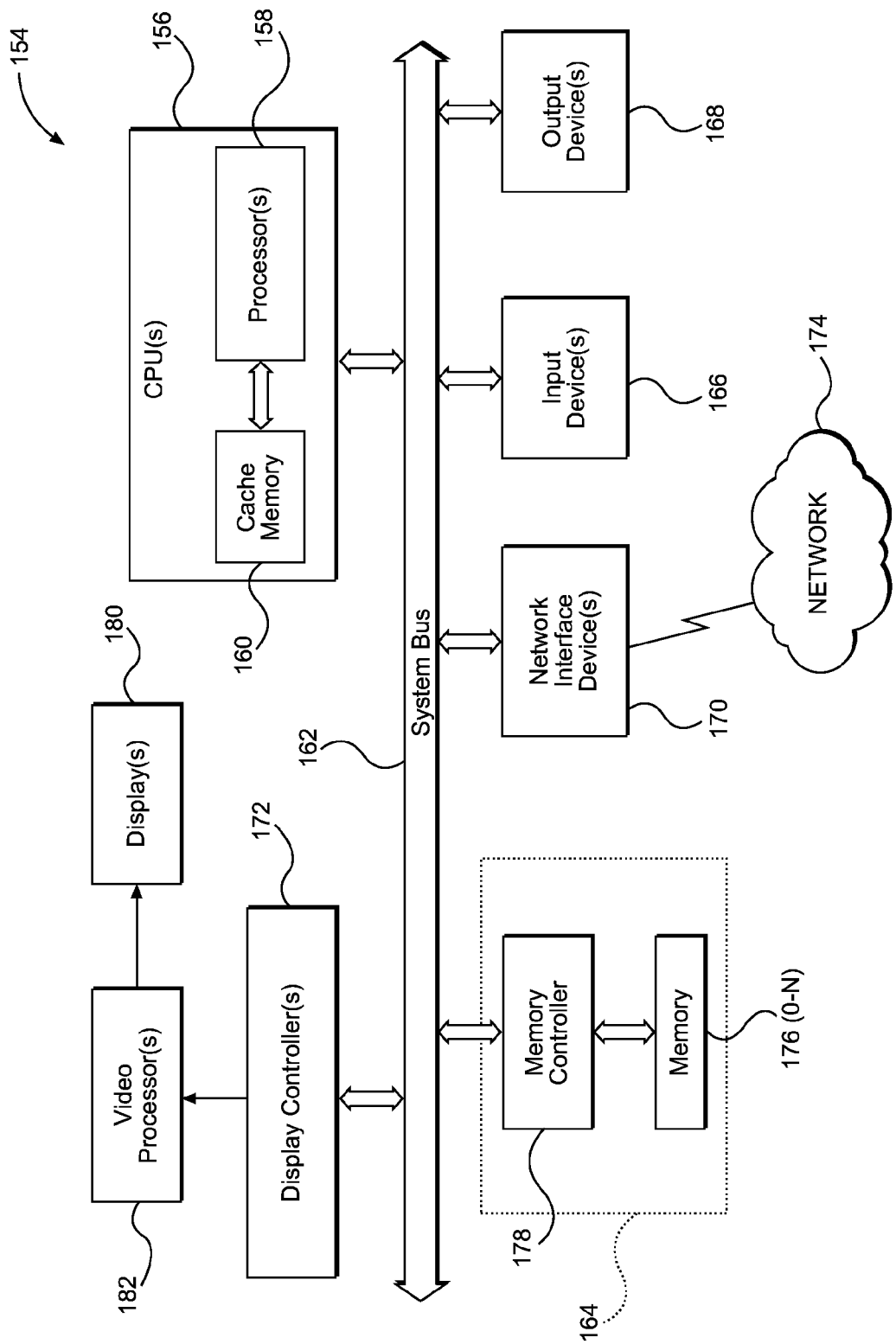
FIG. 9 illustrates an example of a processor-based system that can be implemented by the 3DIC in FIG. 2, the 3DIC in FIG. 5, or the 3DIC in FIG. 8.

FIG. 9 illustrates an example of a processor-based system 154 that can be implemented by the 3DIC 30 in FIG. 2, the 3DIC 92 in FIG. 5, or the 3DIC 152 in FIG. 8. In this example, the processor-based system 154 includes one or more central processing units (CPUs) 156, each including one or more processors 158. The CPU(s) 156 may have cache memory 160 coupled to the processor(s) 158 for rapid access to temporarily stored data. In this regard, the centralized memory controller placement scheme 26, the distributed memory controller placement scheme 90, or the hybrid memory controller placement scheme 150 may be employed by the cache memory 160. The CPU(s) 156 is coupled to a system bus 162, which may serve as the second shared bus 108 in FIG. 5, and can inter-couple devices included in the processor-based system 154. As is well known, the CPU(s) 156 communicates with these other devices by exchanging address, control, and data information over the system bus 162. Although not illustrated in FIG. 9, multiple system buses 162 could be provided, wherein each system bus 162 constitutes a different fabric.

Other devices can be connected to the system bus 162. As illustrated in FIG. 9, these devices can include a memory system 164, one or more input devices 166, one or more output devices 168, one or more network interface devices 170, and one or more display controllers 172, as examples. The input device(s) 166 can include any type of input device, including but not limited to: input keys, switches, voice processors, etc. The output device(s) 168 can include any type of output device, including but not limited to: audio, video, other visual indicators, etc. The network interface device(s) 170 can be any device configured to allow exchange of data to and from a network 174. The network 174 can be any type of network, including but not limited to: a wired or wireless network, a private or public network, a local area network (LAN), a wireless local area network (WLAN), a wireless wide area network (WWAN), or the Internet. The network interface device(s) 170 can be configured to support any type of communications protocol desired. The memory system 164 can include one or more memory units 176(0-N) and a memory controller 178. The memory controller 178 may be disposed in the processor-based system 154 according to the centralized memory controller placement scheme 26, the distributed memory controller placement scheme 90, or the hybrid memory controller placement scheme 150.

The CPU(s) 156 may also be configured to access the display controller(s) 172 over the system bus 162 to control information sent to one or more displays 180. The display controller(s) 172 sends information to the display(s) 180 to be displayed via one or more video processors 182, which process the information to be displayed into a format suitable for the display(s) 180. The display(s) 180 can include any type of display, including but not limited to: a cathode ray tube (CRT), a light emitting diode (LED) display, a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master devices and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A three-dimensional (3D) integrated circuit (IC) (3DIC) comprising:
    a plurality of semiconductor IC tiers;
    a memory controller circuit disposed in a semiconductor IC tier among the plurality of semiconductor IC tiers and coupled to one or more memory buses;
    at least one processor core disposed in at least one of the plurality of semiconductor IC tiers and communicatively coupled to the memory controller circuit;
    at least one memory IC disposed in at least one of the plurality of semiconductor IC tiers;
    a plurality of distributed through-silicon-via (TSV) farms each configured to electrically interconnect the plurality of semiconductor IC tiers, wherein each of the plurality of distributed TSV farms comprises a plurality of TSVs; and
    two or more memory-access TSV farms selected from the plurality of distributed TSV farms and configured to provide interconnections to the at least one memory IC;
    wherein each of the one or more memory buses is connected to the at least one memory IC through a respective memory-access TSV farm among the two or more memory-access TSV farms;

wherein the memory controller circuit is placed to provide an approximately equal wire-length to each of the two or more memory-access TSV farms;

wherein the memory controller circuit is configured to service memory access requests between the at least one processor core and the at least one memory IC.

2. The 3DIC of claim 1, wherein the at least one memory IC is comprised of a wide-input-output (Wide-IO) memory IC.

3. The 3DIC of claim 2, wherein the at least one memory IC comprises a plurality of connection pins that are evenly divided to one or more connection pin clusters, wherein each of the one or more connection pin clusters is coupled to one of the one or more memory buses.

4. The 3DIC of claim 1, wherein:
the memory controller circuit is placed at a geometric center of the two or more memory-access TSV farms to provide the approximately equal wire-length to each of the two or more memory-access TSV farms; and
the memory controller circuit is further configured to:
receive the memory access requests from the at least one processor core;
dynamically select at least one memory bus among the one or more memory buses to service the memory access requests, wherein selection of the at least one memory bus for servicing the memory access requests is based on load conditions among the one or more memory buses; and
provide memory access results received from the one or more memory buses to the at least one processor core.

5. The 3DIC of claim 1, wherein the at least one processor core is disposed in a bottom semiconductor IC tier of the 3DIC adjacent to a semiconductor substrate.

6. The 3DIC of claim 1, further comprising:
a second memory controller circuit disposed in at least one of the plurality of semiconductor IC tiers and coupled to one or more second memory buses;
at least one second processor core disposed in at least one of the plurality of semiconductor IC tiers and communicatively coupled to the second memory controller circuit;
at least one second memory IC disposed in at least one of the plurality of semiconductor IC tiers; and
one or more second memory-access TSV farms selected from the plurality of distributed TSV farms and configured to provide interconnections to the at least one second memory IC;
wherein each of the one or more second memory buses is connected to the at least one second memory IC through a respective second memory-access TSV farm among the one or more second memory-access TSV farms;
wherein the second memory controller circuit is configured to service memory access requests between the at least one second processor core and the at least one second memory IC.

7. The 3DIC of claim 6, wherein the second memory controller circuit comprises:
one or more memory controllers, wherein:
each of the one or more memory controllers is placed adjacent to the respective second memory-access TSV farm among the one or more second memory-access TSV farms; and
each of the one or more memory controllers is coupled to a memory bus comprised in the respective second memory-access TSV farm; and an arbiter communicatively coupled to the one or more memory controllers via a first shared bus and communicatively coupled to the at least one second processor core via a second shared bus;
wherein the arbiter is configured to:
receive the memory access requests from the at least one second processor core via the second shared bus;
dynamically select at least one memory controller among the one or more memory controllers to service the memory access requests, wherein selection of the at least one memory controller for servicing the memory access requests is based on load conditions among the one or more memory controllers;
provide the memory access requests to the at least one selected memory controller via the first shared bus;
arbitrate access to the first shared bus by the one or more memory controllers; and
provide memory access results received from the one or more memory controllers to the at least one second processor core via the second shared bus.

8. The 3DIC of claim 6, wherein the memory controller circuit and the second memory controller circuit are disposed in different semiconductor IC tiers of the 3DIC.

9. The 3DIC of claim 6, wherein the at least one second memory IC is the at least one memory IC.

10. The 3DIC of claim 6, wherein the at least one second processor core is the at least one processor core.

11. The 3DIC of claim 6, wherein the one or more second memory-access TSV farms configured to provide interconnections to the at least one second memory IC are at least one of the two or more memory-access TSV farms configured to provide interconnections to the at least one memory IC.

12. A three-dimensional (3D) integrated circuit (IC) (3DIC) means, comprising:
a plurality of semiconductor IC tiers;
a means for controlling memory disposed in at least one of the plurality of semiconductor IC tiers and coupled to one or more memory buses;
at least one means for processing disposed in at least one of the plurality of semiconductor IC tiers and communicatively coupled to the means for controlling memory;
at least one means for storing data disposed in at least one of the plurality of semiconductor IC tiers;
a plurality of means for electrically interconnecting the plurality of semiconductor IC tiers, wherein each of the plurality of means for electrically interconnecting the plurality of semiconductor IC tiers comprises one or more through-silicon-via (TSVs); and
two or more means for accessing memory selected from the plurality of means for electrically interconnecting the plurality of semiconductor IC tiers and configured to provide interconnections to the at least one means for storing data;
wherein each of the one or more memory buses is connected to the at least one means for storing data through a respective means for accessing memory among the two or more means for accessing memory;
wherein the means for controlling memory is placed to provide an approximately equal wire-length to each of the two or more means for accessing memory;
wherein the means for controlling memory is configured to service memory access requests between the at least one means for processing and the at least one means for storing data.

13. A method for placing memory controllers in a three-dimensional (3D) integrated circuit (IC) (3DIC) employing distributed through-silicon-via (TSV) farms, comprising:
- disposing at least one memory IC in at least one of a plurality of semiconductor IC tiers;
- determining two or more memory-access TSV farms among a plurality of distributed TSV farms employed by a 3DIC based on placement of the at least one memory IC, wherein the two or more memory-access TSV farms are configured to provide interconnections to the at least one memory IC across the plurality of semiconductor IC tiers;
- disposing a memory controller circuit in at least one of the plurality of semiconductor IC tiers of the 3DIC;
- coupling one or more memory buses to the at least one memory IC through the two or more memory-access TSV farms, wherein each of the two or more memory-access TSV farms comprises a respective memory bus among the one or more memory buses;
- placing the memory controller circuit to provide an approximately equal wire-length to each of the two or more memory-access TSV farms;
- coupling the memory controller circuit to the one or more memory buses;
- communicatively coupling the memory controller circuit to at least one processor core in the 3DIC; and
- configuring the memory controller circuit to service memory access requests between the at least one processor core and the at least one memory IC.

14. The method of claim 13, further comprising:
- disposing a second memory controller circuit in at least one of the plurality of semiconductor IC tiers;
- disposing at least one second memory IC in at least one of the plurality of semiconductor IC tiers;
- determining one or more second memory-access TSV farms among the plurality of distributed TSV farms employed by the 3DIC based on placement of the at least one second memory IC, wherein the one or more second memory-access TSV farms are configured to provide interconnections to the at least one second memory IC across the plurality of semiconductor IC tiers;
- disposing the second memory controller circuit in at least one of the plurality of semiconductor IC tiers of the 3DIC;
- coupling one or more second memory buses to the at least one second memory IC through the one or more second memory-access TSV farms, wherein each of the one or more second memory-access TSV farms comprises a respective second memory bus among the one or more second memory buses;
- coupling the second memory controller circuit to the one or more second memory buses;
- communicatively coupling the second memory controller circuit to at least one second processor core in the 3DIC; and
- configuring the second memory controller circuit to service memory access requests between the at least one second processor core and the at least one second memory IC.

15. The method of claim 14, further comprising:
- providing one or more memory controllers in the second memory controller circuit;
- disposing each of the one or more memory controllers adjacent to a respective second memory-access TSV farm among the one or more second memory-access TSV farms and coupling each of the one or more memory controllers to a respective second memory bus comprised in the respective second memory-access TSV farm;
- coupling the one or more memory controllers to a first shared bus;
- providing an arbiter and coupling the arbiter to the first shared bus;
- communicatively coupling the arbiter to the at least one second processor core; and
- configuring the arbiter to:
  - receive the memory access requests from the at least one second processor core;
  - dynamically select at least one memory controller among the one or more memory controllers to service the memory access requests, wherein selection of the at least one memory controller for servicing the memory access requests is based on load conditions among the one or more memory controllers;
  - provide the memory access requests to the at least one selected memory controller via the first shared bus;
  - arbitrate access to the first shared bus by the one or more memory controllers; and
  - provide memory access results received from the one or more memory controllers to the at least one second processor core.

16. A three-dimensional (3D) integrated circuit (IC) (3DIC) comprising:
- a plurality of semiconductor IC tiers;
- a memory controller circuit disposed in a semiconductor IC tier among the plurality of semiconductor IC tiers and coupled to one or more memory buses;
- at least one processor core disposed in at least one of the plurality of semiconductor IC tiers and communicatively coupled to the memory controller circuit;
- at least one memory IC disposed in at least one of the plurality of semiconductor IC tiers;
- a plurality of distributed through-silicon-via (TSV) farms each configured to electrically interconnect the plurality of semiconductor IC tiers, wherein each of the plurality of distributed TSV farms comprises a plurality of TSVs; and
- one or more memory-access TSV farms selected from the plurality of distributed TSV farms and configured to provide interconnections to the at least one memory IC;
- wherein the memory controller circuit comprises:
  - one or more memory controllers, wherein:
    - each of the one or more memory controllers is placed adjacent to a respective memory-access TSV farm among the one or more memory-access TSV farms; and
    - each of the one or more memory controllers is coupled to a memory bus comprised in the respective memory-access TSV farm; and
  - an arbiter communicatively coupled to the one or more memory controllers via a first shared bus and communicatively coupled to the at least one processor core via a second shared bus, the arbiter configured to:
    - receive memory access requests from the at least one processor core via the second shared bus;
    - dynamically select at least one memory controller among the one or more memory controllers to service the memory access requests, wherein selection of the at least one memory controller for servicing the memory access requests is based on load conditions among the one or more memory controllers;

provide the memory access requests to the at least one selected memory controller via the first shared bus;

arbitrate access to the first shared bus by the one or more memory controllers; and provide memory access results received from the one or more memory controllers via the first shared bus to the at least one processor core via the second shared bus.

17. The 3DIC of claim 16, wherein the at least one memory IC is comprised of a wide-input-output (Wide-IO) memory IC.

18. The 3DIC of claim 17, wherein the at least one memory IC comprises a plurality of connection pins that are evenly divided to one or more connection pin clusters, wherein each of the one or more connection pin clusters is coupled to one of the one or more memory buses.

19. The 3DIC of claim 16, wherein the at least one processor core is disposed in a bottom semiconductor IC tier of the 3DIC adjacent to a semiconductor substrate.

20. The 3DIC of claim 16, wherein the arbiter is at least one of the one or more memory controllers or the at least one processor core.

21. A method for placing memory controllers in a three-dimensional (3D) integrated circuit (IC) (3DIC) employing distributed through-silicon-via (TSV) farms, comprising:

disposing at least one memory IC in at least one of a plurality of semiconductor IC tiers;

determining one or more memory-access TSV farms among a plurality of distributed TSV farms employed by a 3DIC based on placement of the at least one memory IC, wherein the one or more memory-access TSV farms are configured to provide interconnections to the at least one memory IC across the plurality of semiconductor IC tiers;

disposing a memory controller circuit in at least one of the plurality of semiconductor IC tiers of the 3DIC;

providing one or more memory controllers in the memory controller circuit;

disposing each of the one or more memory controllers adjacent to a respective memory-access TSV farm among the one or more memory-access TSV farms and coupling each of the one or more memory controllers to a respective memory bus comprised in the respective memory-access TSV farm;

coupling the one or more memory controllers to a first shared bus;

providing an arbiter and coupling the arbiter to the first shared bus;

communicatively coupling the arbiter to at least one processor core; and configuring the arbiter to:

receive memory access requests from the at least one processor core;

dynamically select at least one memory controller among the one or more memory controllers to service the memory access requests, wherein selection of the at least one memory controller for servicing the memory access requests is based on load conditions among the one or more memory controllers;

provide the memory access requests to the at least one selected memory controller via the first shared bus;

arbitrate access to the first shared bus by the one or more memory controllers; and provide memory access results received from the one or more memory controllers to the at least one processor core.

22. The method of claim 21, wherein providing the arbiter comprises assigning at least one of the one or more memory controllers as the arbiter.

23. The method of claim 21, further comprising disposing the at least one processor core in a bottom semiconductor IC tier of the 3DIC adjacent to a semiconductor substrate.

24. The method of claim 21, further comprising configuring at least one of the one or more memory controllers to function as the arbiter.

25. The method of claim 21, further comprising configuring the at least one processor core to function as the arbiter.

* * * * *